(12) United States Patent
Yamamoto

(10) Patent No.: US 7,430,950 B2
(45) Date of Patent: Oct. 7, 2008

(54) APPARATUS FOR CUTTING ADHESIVE TAPE

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 276 days.

(21) Appl. No.: 10/961,160

(22) Filed: Oct. 12, 2004

(65) Prior Publication Data

US 2005/0115666 A1    Jun. 2, 2005

(30) Foreign Application Priority Data

Nov. 28, 2003   (JP) ............................. 2003-399314

(51) Int. Cl.
   *B26D 3/08*   (2006.01)
(52) U.S. Cl. .......................................... 83/490; 83/591
(58) Field of Classification Search ................ 83/745, 83/873, 591, 592, 13, 564, 490
   See application file for complete search history.

(56) References Cited

U.S. PATENT DOCUMENTS

| | | | |
|---|---|---|---|
| 1,299,688 A | * | 4/1919 | De Long ...................... 83/490 |
| 2,854,076 A | * | 9/1958 | Keim ........................... 83/490 |
| 4,593,467 A | * | 6/1986 | Safar ............................ 30/300 |
| 4,602,434 A | * | 7/1986 | Stradling ..................... 30/372 |
| 4,925,515 A | * | 5/1990 | Yoshimura et al. .......... 156/250 |
| 4,934,054 A | * | 6/1990 | Morozumi .................... 30/293 |
| 5,233,748 A | * | 8/1993 | Logan et al. .................. 30/310 |
| 6,606,927 B1 | * | 8/2003 | Lisec ............................. 83/13 |
| 6,767,426 B1 | * | 7/2004 | Yamamoto ................... 156/270 |
| 2001/0002569 A1 | * | 6/2001 | Lee et al. ....................... 83/873 |

FOREIGN PATENT DOCUMENTS

JP        11-003876 A1    1/1999

* cited by examiner

*Primary Examiner*—Kenneth E. Peterson
*Assistant Examiner*—Phong Nguyen
(74) *Attorney, Agent, or Firm*—Cheng Law Group PLLC

(57) ABSTRACT

In a method of making a cutter revolve along a circumference of a circle having an optional size to cut an adhesive tape into a circular shape of a predetermined size, the cutter is made revolve while being tilted to an inner circumferential side in the revolving direction of the circumference, and a cutting start point and a cutting end point in a cutting path of the cutter are made coincide with each other.

6 Claims, 3 Drawing Sheets

APPARATUS FOR CUTTING ADHESIVE TAPE

BACKGROUND OF THE INVENTION (1) Field of the Invention

The present invention relates to a method and an apparatus for cutting an adhesive tape into a circular shape. More particularly, the present invention relates to a method and an apparatus for cutting an adhesive tape joined to a ring frame which is mounted at the time of dicing a semiconductor wafer.

(2) Description of the Related Art

Generally, a surface protective tape is preliminarily joined to the surface of a semiconductor wafer (hereinafter, simply referred to as a wafer), which has been subjected to a pattern forming process, and part of the surface protective tape, which protrudes from the outer circumference of the wafer is cut out along the outer peripheral edge of the wafer. In a state where the whole surface of the wafer is protected with the surface protective tape, a wafer back-side polishing process is performed on the back side of the wafer which is put upside down. After that, an adhesive tape for dicing is joined to the back side of the wafer on which the wafer back-side polishing process has been completed and is integrated with a ring frame for a chip dicing process. At this time, the adhesive tape is joined to the ring frame and is cut in a circular shape by making a cutter come into contact with the adhesive tape joined to the ring frame and revolve once around the center of the ring frame as a base point (see, for example, JP-A 11-3876 (1999)).

However, as also described in JP-A 11-3876 (1999), since the adhesive tape for dicing is cut while pressing the cutter against the ring frame, the path of cutting by the cutter remains in the face of the ring frame. Consequently, even when the ring frame is made of, for example, metal or resin, after repetitive use, at the time of cutting, the cutter enters the cutting path of the cutter, formed during the past cutting operations. As a result, there is a case such that the course of the cutter is forcedly changed and a cutting start point and a cutting end point do not coincide with each other. In such a case, the adhesive tape remains in a whisker shape. When remained adhesive tapes are stacked, the thickness of the adhesive tapes increases in the portion and it may cause a problem in following processes such as a process of separating the protective tape from the surface of the wafer and a wafer process such as a dicing process.

In the technique disclosed in JP-A 11-3876 (1999), a needle member is used as the cutter for cutting the adhesive tape so that the cutting path does not remain in the ring frame so much. Therefore, the ring frame can be used a plurality of times. In recent years, however, as the diameter of a wafer increases and the thickness of the wafer decreases, there is a trend that the thickness of the adhesive tape for dicing increases and the rigidity of the adhesive tape increases. Consequently, it is difficult for the needle-shaped cutter as described in JP-A 11-3876 (1999) to cut the adhesive tape so that the cutting start point and the cutting end point meet are made coincide with each other. In the case of using a knife-shaped cutter or a round-blade cutter which has been conventionally used, the cutter enters the cutting path formed in the past cutting operations at the time of cutting as described above. It becomes difficult to accurately cut the adhesive tape in a circular shape and, in some cases, the adhesive tape remains in a whisker shape at the cutting start point and the cutting end point.

SUMMARY OF THE INVENTION

The present invention is made in view of the above circumstances and its object is to provide an adhesive tape cutting method and an adhesive tape cutting apparatus capable of cutting an adhesive tape so that a cutting start point and a cutting end point in a cutting path of a cutter coincide with each other even when a conventionally-used knife-shaped or round-blade cutter is used.

In order to achieve the above object, the present invention employs the following configuration:

A method of making a cutter revolve along a circumference of a circle having an optional size to cut an adhesive tape into a circular shape of a predetermined size, the method comprising the step of:

making the cutter revolve while being tilted to an inner circumference side in the revolving direction, and making a cutting start point and a cutting end point in a cutting path of the cutter coincide with each other.

According to the method of the present invention, by making the cutter revolve while being tilted to the inner circumference side of the circumference, the contact portion between the cutter and the adhesive tape becomes large at the time of cutting. Consequently, the cutter does not enter a cutting path of the cutter formed by the preceding cutting operations so that the cutting start point and the cutting end point in the cutting path of the cutter can coincide with each other. To be specific, even in the case of cutting the adhesive tape into a circular shape, a whisker-shaped residue which generates due to a positional deviation between the cutting start point and the cutting end point does not occur, and the adhesive tape can be reliably cut into a circular shape.

In the method according to the present invention, the adhesive tape is cut into a circular shape by making the cutter revolve while making the cutter come into contact with a ring frame on which a semiconductor wafer is mounted by the adhesive tape.

According to this method, the adhesive tape is cut into a circular shape by making the cutter revolve while making the cutter come into contact with the surface of the ring frame, so that a process of integrating the semiconductor wafer with the ring frame can be performed by a series of operations.

Preferably, an angle of the cutter tilted to the inner circumference side in the revolting direction is set in, for example, a range from 80° to 90° from an imaginary line extending in a radial direction from the center of a semiconductor wafer. Also preferably, a revolving speed of the cutter is set in, for example, a range from 30 to 300 mm/s.

In order to achieve the above object, the present invention also employs the following configuration:

An apparatus for cutting an adhesive tape into a circular shape of an optional size, the apparatus comprising:

a cutter for cutting the adhesive tape while revolving along a circumference of an optional size;

a rotating mechanism for revolving the cutter;

an angle adjusting mechanism capable of adjusting an angle of the cutter so as to be tilted to an inner circumference side in the revolving direction at the time of revolving the cutter along the optional circumference by the rotating mechanism; and a lifting mechanism for moving the cutter in a vertical direction.

In the apparatus according to the present invention, for example, in the case of cutting, into a circular shape, the adhesive tape joined to the ring frame on which a wafer is mounted, the cutting start point and the cutting end point can be made coincide with each other. Thus, the adhesive tape can be cut without a whisker-shaped residue in the cut adhesive-tape.

Preferably, the rotating mechanism of the apparatus according to the present invention includes a plurality of arms each radially extending from the axis of rotation at equal intervals, one of the arms has the cutter, and another arm has, at its tip end, a roller which comes into contact with and supports a non-adhesive face of the adhesive tape while rotating.

With this configuration, at the time of cutting an adhesive tape, for example, the ring frame to which the adhesive tape is joined can be reliably supported, rattles and the like of the ring frame can be suppressed at the time of cutting the adhesive tape, and the adhesive tape can be cut with good precision.

The angle adjusting mechanism of the apparatus according to the present invention includes: a supporting member for supporting the cutter to the arm; and a block having an inclined angle for fixing the supporting member to the arm. With the configuration, the cutter angle adjustment is facilitated.

In the apparatus according to the present invention, preferably, the angle adjusting mechanism has a spring member for pressing the cutter against the adhesive tape.

With this configuration, the spring member can press the cutter against the non-adhesive face of the adhesive tape and, also, absorb micro-vibrations in the vertical direction of the cutter at the time of cutting the adhesive tape.

In the apparatus according to the present invention, preferably, the cutter is a round-blade cutter.

With this configuration, since the cutter is a round-blade cutter, the pressing force at the time of cutting is high. Consequently, even an adhesive tape, which is thick and has high rigidity, can be cut with reliability.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of the present invention will be described below with reference to the drawings.

Figure 1:
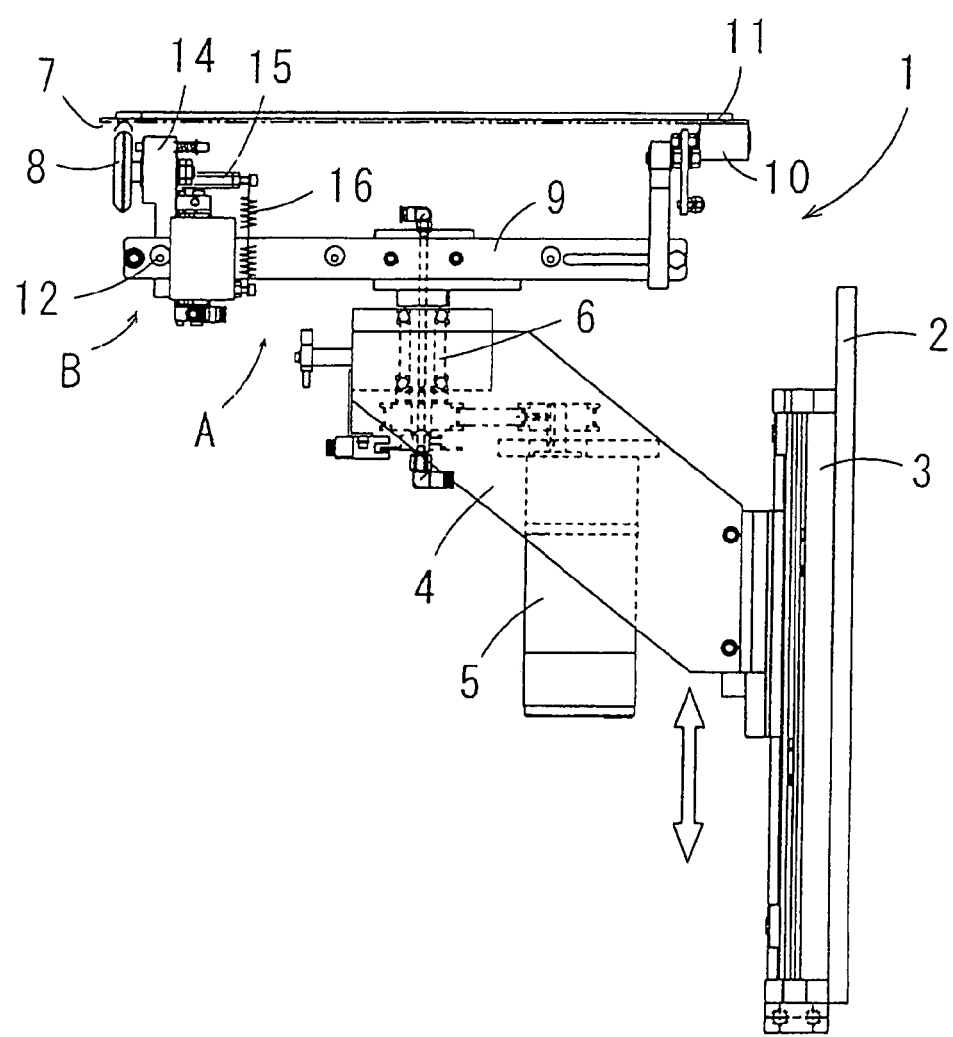
FIG. 1 is a schematic side view showing a main part of an adhesive tape cutting apparatus according to the present invention.
Figure 2:
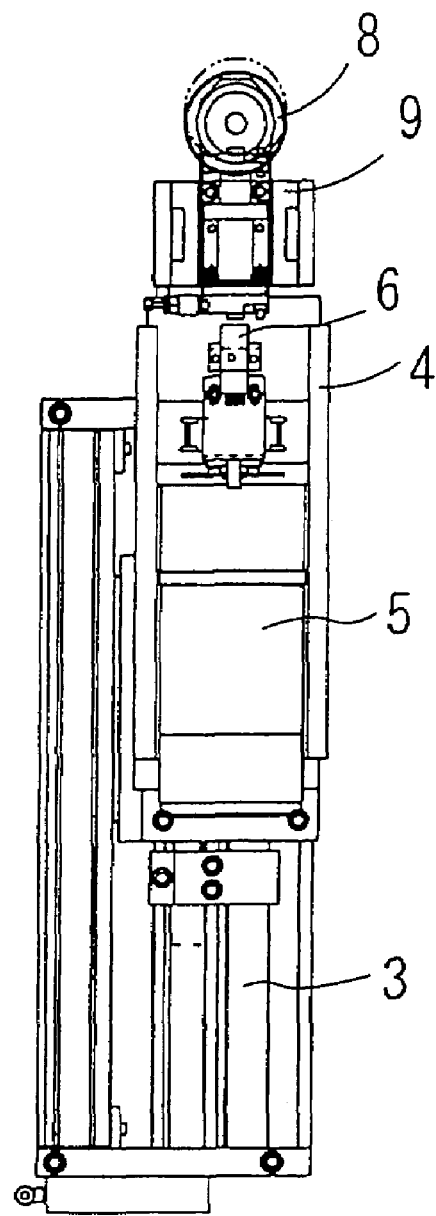
FIG. 2 is a schematic front view showing a main part of the adhesive tape cutting apparatus according to the present invention.
Figure 3:
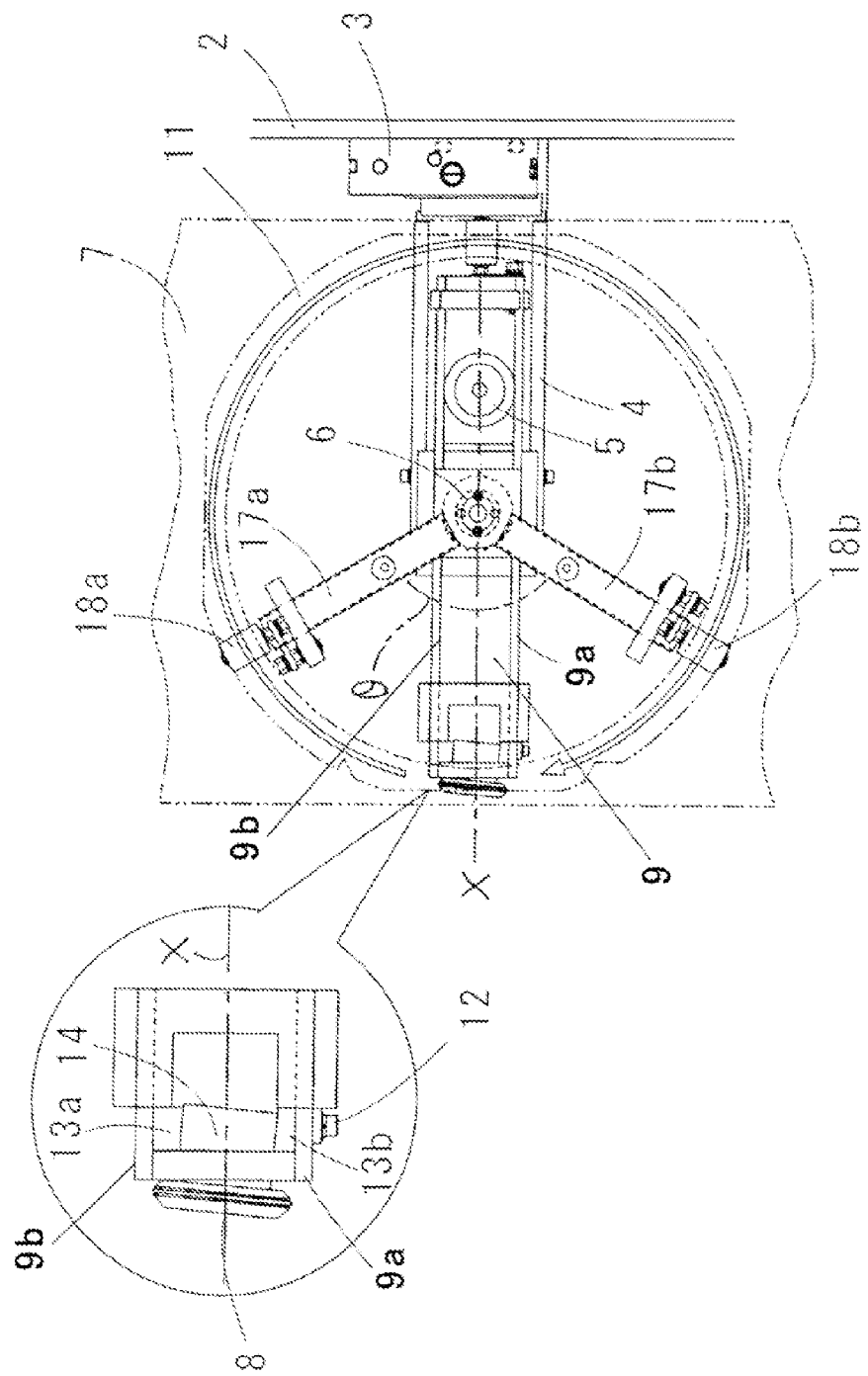
FIG. 3 is a schematic plan view showing a main part of the adhesive tape cutting apparatus according to the present invention.

FIGS. 1, 2 and 3 are a schematic side view, a schematic front view and a schematic plan view, respectively, of an adhesive tape cutting apparatus according to the present invention. In the following description of the embodiment, a method of cutting an adhesive tape joined to a ring frame on which a wafer is mounted will be described as an example. However, the present invention is not limited to the following embodiment.

An adhesive tape cutting apparatus 1 according to the embodiment comprises, as shown in the schematic side view of FIG. 1, a frame 2 of an adhesive tape adhering apparatus or the like on which the apparatus 1 is provided, a guide 3 fixed to the frame 2, and a lifting frame 4 as a component of a lifting mechanism supported to the guide 3 so as to be movable in a vertical direction. The lifting frame 4 includes a rotating mechanism A for revolving a cutter 8 which cuts an adhesive tape 7.

The rotating mechanism A includes the cutter 8 for cutting the adhesive tape 7 at one end, a rotary arm 9 having a roller 10 which supports a ring frame 11 to which the adhesive tape 7 is joined at the other end, a rotary shaft 6 to which the rotary arm 9 is fixed, and a motor 5 coupled to the rotary shaft 6 and provided on the lifting frame 4 which rotates the rotary arm 9. The rotary arm 9 comprises a pair of arm pieces 9a, 9b extending parallel to one another in a disposed apart relationship.

Although the cutter 8 may have a knife shape or a round-blade shape, the round-blade shape is preferable. With this shape, even in the case where the adhesive tape 7 is thick and has high rigidity, the cutter 8 can be pressed against the ring frame 11 with a high pressing force. Also in the case where the cutter 8 is pressed against the ring frame 11 with a high pressing force as described above, the adhesive tape 7 can be cut with reliability by rotating the cutter 8 being in contact with the ring frame 11. The cutter 8 is provided on a supporting member 14 so that the cutter 8 is tilted toward an inner circumferential side in the rotating direction when rotated by the rotating mechanism A. The supporting member 14 is attached to the rotary arm 9 via an angle adjusting mechanism B so that the edge of the cutter can be adjusted at an optional angle. Since the cutter 8 is attached so as to tilt toward the inner circumferential side in the rotating direction and cuts the adhesive tape 7 in a circular shape, the cutting path of the cutter 8 does not become a linear path corresponding to the thickness of the cutter 8, but becomes a wide path. Therefore, even after the cutting operation is repeated plural times, the edge of the cutter 8 does not fit in the path formed by the preceding cutting operations, the cutting path does not fluctuate, and the cutting start point and the cutting end point coincide with each other.

As shown in FIG. 3 in an enlarged manner, the angle adjusting mechanism B in the embodiment for adjusting the cutter 8 at an optional angle so that the cutter 8 tilts toward the inner circumference side is a mechanism for sandwiching the supporting member 14 in the rotary arm 9 via inclination blocks 13a, 13b inclined at an optional angle and fixing it by a screw 12 at the time of fixing the supporting member 14 to the rotary arm 9. With this mechanism, the angle is adjusted so that the cutter 8 is inclined toward the inner circumferential side in the rotating direction of the rotary arm 9. As the angle adjusting mechanism B, except for using the inclination blocks 13a, 13b, an inclined portion can be formed in the supporting member 14 for the cutter 8.

A shaft member 15 is provided on the side opposite to the cutter 8, of the supporting member 14 for supporting the cutter 8, and a spring member 16 is provided on the end of the shaft member 15. The spring member 16 presses the cutter 8 at the other end against the non-adhesive face of the adhesive tape 7 and absorbs micro-vibrations in the vertical direction of the cutter 8 at the time of cutting the adhesive tape 7. Therefore, the adhesive tape 7 can be cut reliably and accurately by the cutter 8.

As shown in FIG. 3, the rotary shaft 6 is provided with arm members 17a, 17b having rollers 18a, 18b at their tip ends, respectively. Preferably, the arm members 17a, 17b are disposed at an open angle θ of 120° around the rotary shaft 6 as a center to support the ring frame 11 by three points of the arm members 17a, 17b and the roller 10 provided on the other end of the rotary arm 9. With this configuration, the ring frame 11 to which the adhesive tape 7 is joined can be supported reliably at the time of cutting the adhesive tape 7, and the adhesive tape 7 can be cut while suppressing rattles and the like of the ring frame 11 at the time of cutting. The arm members 17a, 17b are not shown in FIGS. 1 and 2.

A method of cutting the adhesive tape 7 by the apparatus 1 constructed as described above will now be described.

First, the supporting member 14 to which the cutter 8 is attached is fixed to the rotary arm 9 by using the inclination blocks 13a, 13b arranged at a predetermined inclination angle. It is preferable to attach the cutter 8 so as to tilt to the inner circumference side at an angle of 90° to 80° from the rotation axis of the rotary arm 9. In other words, the cutter 9 is inclined in a range of 90° to 80° from an imaginary line X extended from the center of the wafer.

Next, the lifting frame 4 is moved upward until the cutter 8 and the rollers 10, 18a, 18b come into contact with the ring frame 11 on which a wafer to which an adhesive tape is joined is mounted and which is integrated with the wafer. While making the cutter 8 come into contact with the ring frame 11, the rotary arm 9 is rotated once at a predetermined rotation speed, thereby cutting the adhesive tape 7 joined to the ring frame 11 into a circular shape. In such a manner, the adhesive tape 7 can be cut so that the cutting start point and the cutting end point of the cutter 8 coincide with each other. Herein, preferable rotating speed of the rotary arm 9 is set in a range from 30 to 300 mm/s. In such a manner, even an adhesive tape having large thickness and high rigidity adapted to a wafer whose diameter is increasing and whose thickness is decreasing in recent years can be cut.

According to the present invention, as described above, the cutter 8 is attached while adjusting the angle so that the cutter 8 is tilted to the inner circumferential side in the rotating direction. By rotating the rotary arm 9 once, a wide cutting path is obtained. Thus, without being influenced by cutting paths formed by previous cutting operations, the cutting start point and the cutting end point can be made coincide with each other. Consequently, generation of a whisker-shaped residue after cutting the adhesive tape can be suppressed.

The adhesive tape cutting apparatus 1 according to the present invention can be applied to an apparatus for joining an adhesive tape for dicing which is generally used. Although the case of moving the cutter 8 upward to cut the adhesive tape while coming into contact with the under side of the ring frame has been described as an example in the foregoing embodiment, the adhesive tape cutting apparatus according to the present invention is not limited to this embodiment. It is also possible to move the cutter 8 downward from above the ring frame and cut the adhesive tape while allowing the cutter to come into contact with the top side of the ring frame.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for cutting an adhesive tape into a circular shape of an optional size, the apparatus comprising:

a cutter for cutting the adhesive tape while revolving along a circumference of an optional size, the cutter having a leading cutter portion leading a trailing cutter portion while the cutter revolves along the circumference of the optional size;
a rotating mechanism for revolving the cutter;
an angle adjusting mechanism for adjusting an angle of the cutter so that the leading cutter portion is oriented toward an axis of rotation while the trailing cutter portion is oriented away from the axis of rotation relative to an imaginary line at which a longitudinal axis intersects a turn radial axis in a traveling direction of the cutter;
a lifting mechanism for moving the cutter in a vertical direction; and
a supporting member disposed between a pair of arm pieces, the cutter being operably connected to the supporting member,
wherein the cutter is oriented perpendicularly to the adhesive tape along an imaginary adhesive tape axis and perpendicularly to the imaginary radial line while the leading cutter portion is oriented toward the axis of rotation at a leading acute cutting angle portion relative to the imaginary line and the trailing cutter portion is oriented away from the axis of rotation at a trailing obtuse cutting angle portion relative to an imaginary radial line,
wherein the rotating mechanism includes a plurality of arms, each arm radially extending from the axis of rotation at equal intervals,
wherein one of the arms has the cutter, the one arm having the cutter including the pair of arm pieces extending parallel to one another in a disposed apart relationship, and
wherein the angle adjusting mechanism includes a first inclination block and a second inclination block, the supporting member being disposed between and in contact with the first and second inclination blocks, respective ones of the first and second inclination blocks being disposed between and in contact with respective ones of the pair of arm pieces.

2. The apparatus according to claim 1, wherein another arm has, at its tip end, a roller which comes into contact with and supports a non-adhesive face of the adhesive tape while rotating.

3. The apparatus according to claim 1, wherein the angle adjusting mechanism includes:
the supporting member for supporting the cutter to the arm; and
the first and second inclination blocks having an inclined angle for fixing the supporting member to the arm.

4. The apparatus according to claim 3, wherein the angle adjusting mechanism has a spring member for pressing the cutter against the adhesive tape.

5. The apparatus according to claim 1, wherein the cutter is a round-blade cutter.

6. The apparatus according to claim 1, wherein the angle adjusting mechanism includes a screw operative for fixing the supporting member between the first and second inclination blocks.

* * * * *